United States Patent
Cheng et al.

(10) Patent No.: US 11,355,552 B2
(45) Date of Patent: Jun. 7, 2022

(54) MEMORY MATERIAL, AND MEMORY DEVICE APPLYING THE SAME

(71) Applicant: MACRONIX INTERNATIONAL CO., LTD., Hsinchu (TW)

(72) Inventors: Huai-Yu Cheng, Hsinchu (TW); I-Ting Kuo, Taoyuan (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 41 days.

(21) Appl. No.: 16/986,316

(22) Filed: Aug. 6, 2020

(65) Prior Publication Data

US 2022/0045128 A1 Feb. 10, 2022

(51) Int. Cl.
*H01L 27/24* (2006.01)
*H01L 45/00* (2006.01)

(52) U.S. Cl.
CPC .......... *H01L 27/2427* (2013.01); *H01L 45/06* (2013.01); *H01L 45/1233* (2013.01); *H01L 45/1253* (2013.01); *H01L 45/143* (2013.01)

(58) Field of Classification Search
CPC .................................................. H01L 27/2427
See application file for complete search history.

(56) References Cited

U.S. PATENT DOCUMENTS

| 10,998,499 | B2 | 5/2021 | Lee | |
| 2018/0277601 | A1* | 9/2018 | Ahn | .......................... H01L 45/06 |
| 2020/0411759 | A1 | 12/2020 | Sei et al. | |
| 2021/0249598 | A1* | 8/2021 | Zheng | ................... H01L 45/144 |

FOREIGN PATENT DOCUMENTS

| CN | 110844891 A | 2/2020 |
| CN | 107302053 B | 6/2020 |
| TW | 201946227 A | 12/2019 |

OTHER PUBLICATIONS

TW Office Action dated May 4, 2021 in Taiwan application (No. 109128233).

* cited by examiner

*Primary Examiner* — Mounir S Amer
(74) *Attorney, Agent, or Firm* — McClure, Qualey & Rodack, LLP

(57) ABSTRACT

A memory material and a memory device applying the same are provided. The memory material is a chalcogenide doped with carbon atom. The chalcogenide contains arsenic (As) atom, selenium (Se) atom, germanium (Ge) atom and silicon (Si) atom.

13 Claims, 4 Drawing Sheets

MEMORY MATERIAL, AND MEMORY DEVICE APPLYING THE SAME

BACKGROUND

Technical Field

The disclosure relates to a memory material and a memory device applying the same.

Description of the Related Art

There are many applications for switching devices, such as transistors and diodes, in integrated circuits. One type of switching device is known as the ovonic threshold switch, based on ovonic materials, characterized by a large drop in resistance at a switching threshold voltage, and recovery of a high resistance, blocking state when the voltage falls below a holding threshold. Switching devices have been used, for example, in various programmable resistance memory devices comprising high density arrays of cells organized in a cross-point architecture. Also, ovonic threshold switches have been proposed for a variety of other uses, including so called neuromorphic computing.

One important characteristic of switching devices, particularly in integrated circuits having very large numbers of them, is leakage current. The leakage current is the amount of current flow in a switching device in a sub-threshold state. Also, switching devices are respected to have high endurance. Therefore, it is desirable to provide a switching device with low leakage current, and high endurance.

SUMMARY

The present disclosure relates to a memory material and a memory device applying the same.

According to an embodiment, a memory material is provided. The memory material is a chalcogenide doped with carbon atom. The chalcogenide contains arsenic (As) atom, selenium (Se) atom, germanium (Ge) atom and silicon (Si) atom.

According to another embodiment, a memory device is provided. The memory device comprises a first access line, a second access line and a memory material. The memory material is electrically connected between the first access line and the second access line. The memory material is a chalcogenide doped with carbon atom. The chalcogenide contains arsenic atom, selenium atom, germanium atom and silicon atom.

The above and other embodiments of the disclosure will become better understood with regard to the following detailed description of the non-limiting embodiment(s). The following description is made with reference to the accompanying drawings.

DETAILED DESCRIPTION

Figure 1:
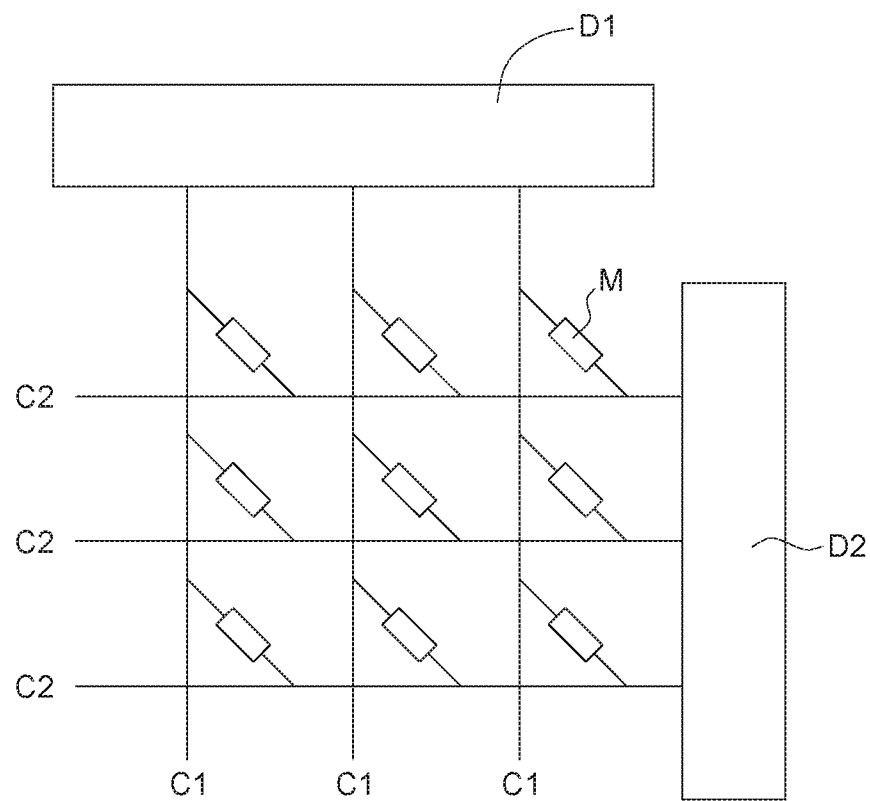
FIG. 1 illustrates a circuit diagram of a memory device in an embodiment.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

In the present disclosure, a content unit "at %" for atom means atomic percent. The so-called "atom" may also mean "element" in the periodic table.

In embodiments, a memory material is a chalcogenide doped with carbon (C) atom. The chalcogenide contains arsenic (As) atom, selenium (Se) atom, germanium (Ge) atom and silicon (Si) atom.

In embodiments, the carbon atom may occupy 5 at % to 20 at % of the memory material. As such, the memory material in embodiments can have better thermal stability, and a memory device (such as an ovonic threshold switch (OTS) selector) applying the memory material can have a stable or improved electrical characteristic. For example, the memory device can have a stable threshold voltage. Otherwise, an un-selected memory cell of the memory device can have a lower leakage current (i.e. off-state current). If the carbon atom occupies less than 5 at % of the memory material, the memory material has no remarkable improvement for thermal stable performance. If the carbon atom occupies more than 20 at % of the memory material, the memory device has a poor electrical characteristic, such as a high off-state current.

The arsenic atom of the chalcogenide occupies 23 at % to 32 at % of the memory material. The selenium atom of the chalcogenide occupies 40 at % to 46 at % of the memory material. The germanium atom of the chalcogenide occupies 8 at % to 25 at % of the memory material. The silicon atom of the chalcogenide occupies 5 at % to 20 at % of the memory material. In an embodiment, the chalcogenide consists essentially of the arsenic atom, the selenium atom, the germanium atom and the silicon atom. Otherwise, a total content of the arsenic atom, the selenium atom, the germanium atom and the silicon atom occupies 100 at % of the chalcogenide.

In an embodiment, the memory material consists essentially of the carbon atom, the arsenic atom, the selenium atom, the germanium atom and the silicon atom. Otherwise, a total content of the carbon atom, the arsenic atom, the selenium atom, the germanium atom and the silicon atom occupies 100 at % of the memory material. In other words, the memory material is C-doped AsSeGeSi.

Compared with a memory material using AsSeGeSi not doped with carbon or un-doped AsSeGeSi in comparative examples, the memory material using the C-doped AsSeGeSi in embodiments can have better thermal stability. In the experiments, the annealing process with a ramping rate of 1° C. per second is performed to the memory material from the room temperature to realize the thermal stability of the memory material. There is almost no difference between colors of a film of C-doped AsSeGeSi in embodiments before and after the annealing process. It indicates that there is no change to a surface roughness of the film of C-doped AsSeGeSi relating to a solid structure phase of the film. Therefore, it is determined that the film of C-doped AsSeGeSi after the annealing process remains the amorphous phase that the film has before the annealing process, even the annealing temperature is up to 500'C. As such, an endurance temperature of the memory material in embodiments can be higher than 500° C. In contrast, in the comparative examples, there is a significant difference between colors of a film of the memory material before and after an annealing process with an annealing temperature of 375° C., indicating that an endurance temperature of the film is lower than 375° C. In a comparative example, an endurance temperature of a Si-doped GeTe$_5$ is lower than 300° C. Specifically, Te crystallizes first above 200° C. and then followed by rhombohedral GeTe crystallization at 300° C. A serious phase separation in the material is observed.

FIG. 1 is referred to, which illustrates a circuit diagram of a memory device in an embodiment. The memory device may comprise first access lines C1, second access lines C2 and memory cells M. The first access line C1 may be one of a bit line and a word line. The second access line C2 may be the other of the bit line and the word line. The memory cells M may be disposed at intersections between the first access lines C1 and the second access lines C2. The memory cell M is electrically connected between the first access line C1 and the second access line C2. In embodiments, each of the memory cells M comprises the memory material containing carbon atom described above. A first access line driver D1 which can be responsive to decoded addresses, is coupled to the first access lines C1, such as the bit lines, and a control circuitry (not shown) is coupled to the first access line driver D1. A second access line driver D2 which can be responsive to decoded addresses, is coupled to the second access lines C2, such as the word lines, and a control circuitry (not shown) is coupled to the second access line driver D2.

The first access line C1 and the second access line C2 may individually comprise tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), titanium silicon nitride (TiSiN), titanium aluminum nitride (TiAlN), tantalum aluminum nitride (TaAlN) TiN/W/TiN, or other materials.

Figure 2:
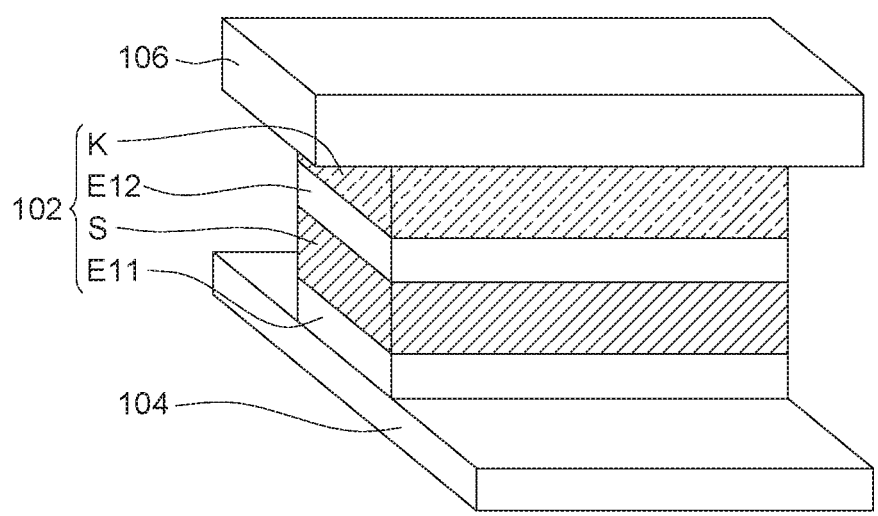
FIG. 2 illustrates a stereogram of a memory device in an embodiment.

FIG. 2 is referred to, which illustrates a stereogram of a memory device in an embodiment. An electrode layer E11 may be on an upper surface of a first conductive line layer 104. The electrode layer E11 and an electrode layer E12 may be respectively on a lower surface and an upper surface of a switch element S. A memory element K may be on an upper surface of the electrode layer E12. A second conductive line layer 106 may be on an upper surface of the electrode layer E12. In an embodiment, the memory cell M (FIG. 1) may comprise the electrode layer E11, the switch element S, the electrode layer E12 and the memory element K. The electrode layer E11, the switch element S, the electrode layer E12 and the memory element K may have a pillar shape. Otherwise, a pillar element 102 may comprise the electrode layer E11, the switch element S, the electrode layer E12 and the memory element K. The pillar element 102 is electrically connected between the first conductive line layer 104 and the second conductive line layer 106. The first access line C1 as shown in FIG. 1 may comprise the first conductive line layer 104. The second access line C2 as shown in FIG. 1 may comprise the second conductive line layer 106.

In embodiments, the switch element S is an ovonic threshold switch (OTS). The switch element S may comprise the memory material containing carbon atom described above.

The memory element K may comprise a phase change material. Embodiments of materials for the memory element K may include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/re, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions may be for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. The memory element K may comprise a layer of chalcogenide and other phase change materials with additives to modify conductivity, transition temperature, melting temperature, and other properties. Representative additives may include nitrogen (N), silicon (Si), oxygen (O), silicon oxide ($SiO_x$), silicon nitride (SiN), copper (Cu), silver (Ag), gold (Au), aluminum (Al), aluminum oxide ($Al_2O_3$), tantalum (Ta), tantalum oxide ($TaO_x$), tantalum nitride (TaN), titanium (Ti), and titanium oxide ($TiO_x$).

The electrode layer E11 and the electrode layer E12 may individually comprise tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), titanium silicon nitride (TiSiN), titanium aluminum nitride (TiAlN), tantalum aluminum nitride (TaAlN), TiN/W/TiN, or other materials.

Figure 3:
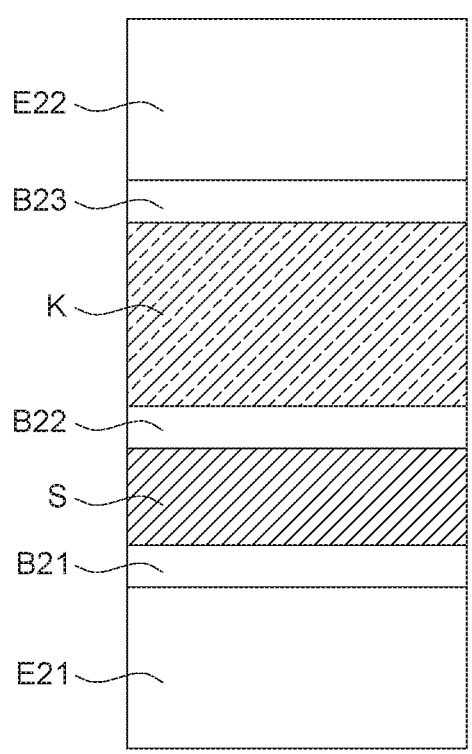
FIG. 3 illustrates a cross-section diagram of a memory device in another embodiment.

FIG. 3 is referred to, which illustrates a cross-section diagram of a memory device in another embodiment. A buffer layer B21 is on an upper surface of an electrode layer E21. The buffer layer B21 and a buffer layer B22 are respectively on the lower surface and the upper surface of the switch element S. The buffer layer B22 and a buffer layer B23 are respectively on a lower surface and an upper surface of the memory element K. An electrode layer E22 is on an upper surface of the buffer layer B23.

In an embodiment, the memory cell M (FIG. 1) may comprise electrode layer E21, the buffer layer B21, the switch element S, the buffer layer B22, the memory element K, the buffer layer B23 and the electrode layer E22. The memory cell M may have a pillar shape.

In an embodiment, the memory cell M (FIG. 1) may comprise the buffer layer B21, the switch element S, the buffer layer B22, the memory element K, and the buffer layer B23. The memory cell M may have a pillar shape. The first access line C1 (FIG. 1) may comprise the electrode layer E21. The second access line C2 (FIG. 1) may comprise the electrode layer E22.

The electrode layer E21 and the electrode layer E22 may individually comprise conductive materials that the electrode layer E11 and the electrode layer E12 can use illustrated with referring to FIG. 2.

The buffer layer B21, the buffer layer B22 and the buffer layer B23 may individually comprise a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). Otherwise, the buffer layer B21, the buffer layer B22 and the buffer layer B23 may individually comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), tantalum oxynitride (TaON), carbon (C), Si doped carbon. Otherwise, a combination of the materials may be used.

Figure 4:
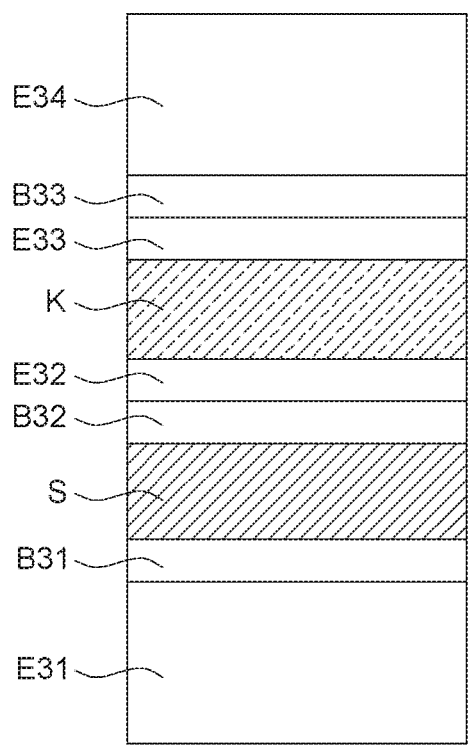
FIG. 4 illustrates a cross-section diagram of a memory device in yet another embodiment.

FIG. 4 is referred to, which illustrates a cross-section diagram of a memory device in yet another embodiment.

An electrode layer E31 and an electrode layer E32 are on a buffer layer B31 and a buffer layer B32 on the lower surface and the upper surface of the switch element S, respectively. The memory element K is on an upper surface of the electrode layer E32. An electrode layer E33 is on the upper surface of the memory element K. A buffer layer B33 is on an upper surface of the electrode layer E33. An electrode layer E34 is on an upper surface of the buffer layer B33.

In an embodiment, the memory cell M (FIG. 1) may comprise the electrode layer E31, the buffer layer B31, the switch element S, the buffer layer B32, the electrode layer E32, the memory element K, the electrode layer E33, the buffer layer B33 and the electrode layer E34. The memory cell M may have a pillar shape.

In an embodiment, the memory cell M (FIG. 1) may comprise the buffer layer B31, the switch element S, the buffer layer B32, the electrode layer E32, the memory element K, the electrode layer E33 and the buffer layer B33. The first access line C1 (FIG. 1) may comprise the electrode layer E31. The second access line C2 (FIG. 1) may comprise the electrode layer E34. The memory cell M may have a pillar shape.

The electrode layer E31, the electrode layer E32, the electrode layer E33 and the electrode layer E34 may individually comprise conductive materials that the electrode layer E11 and the electrode layer E12 can use illustrated with referring to FIG. 2. The buffer layer B31, the buffer layer B32 and the buffer layer B33 may individually comprise buffer materials that the buffer layer B21, the buffer layer B22 and the buffer layer B23 can use illustrated with referring to FIG. 3.

Figure 5:
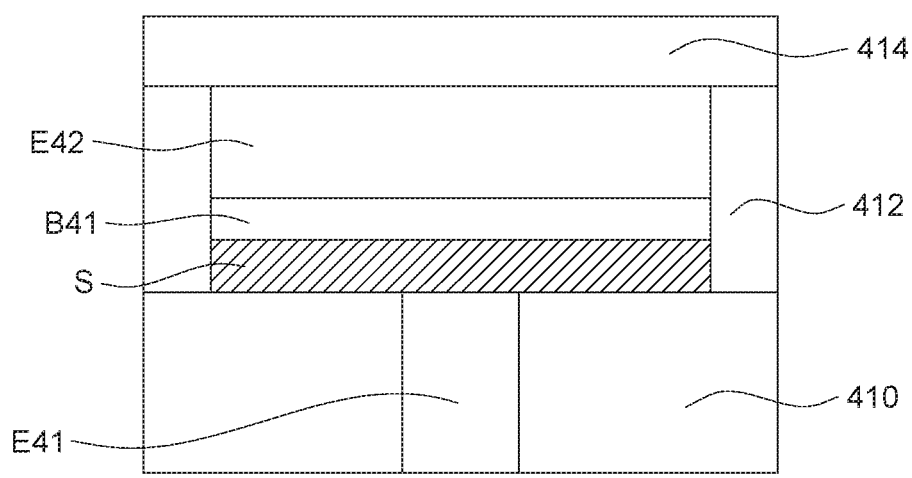
FIG. 5 illustrates a cross-section diagram of a memory device in even yet another embodiment.

FIG. 5 is referred to, which illustrates a cross-section diagram of a memory device in even yet another embodiment. An electrode layer E41 and a buffer layer B41 are respectively on the lower surface and the upper surface of the switch element S. An electrode layer E42 is on an upper surface of the buffer layer B41. The electrode layer E41 may be in an insulating layer 410. The switch element S may be on an upper surface of the insulating layer 410. An insulating layer 412 is on the upper surface of the insulating layer 410. The switch element S, the buffer layer B41 and the electrode layer E42 may be in the insulating layer 412. An insulating layer 414 may be on upper surfaces of the electrode layer E42 and the insulating layer 412. In an embodiment, the memory cell M (FIG. 1) may comprise the electrode layer E41, the switch element S, the buffer layer B41 and the electrode layer E42.

The electrode layer E41 and the electrode layer E42 may individually comprise conductive materials that the electrode layer E11 and the electrode layer E12 can use illustrated with referring to FIG. 2. The buffer layer B41 may comprise buffer materials that the buffer layer B21, the buffer layer B22 and the buffer layer B23 can use illustrated with referring to FIG. 3.

The insulating layer 410, the insulating layer 412 and the insulating layer 414 may individually comprise an oxide such as silicon oxide, a nitride such as silicon nitride, or other suitable dielectric materials.

In embodiments, the switch element S uses the C-doped AsSeGeSi having thermal stable characteristic, and therefore is compatible with a back-end-of-line (BEOL) process for 3D integration, suitable for 3D cross-point technology. The back-end-of-line process may involve a high temperature process, for example using a temperature up to 400° C., used in an integrated CMOS process. In embodiments, the switch element S using the C-doped AsSeGeSi may have a thin thickness, such as 13 nm to 45 nm, such as 20 nm, or thinner than 20 nm, being an expected size feature for process and integration.

In embodiments, the memory device with the switch element S using the C-doped AsSeGeSi can have high endurance performance. For example, the switch element S (using the C-doped AsSeGeSi and having a thickness about 20 nm) of the memory device having a structure similar with FIG. 5 (with the electrode layer E41 and the electrode layer E42 using W, the electrode layer E42 having a thickness of about 40 nm, the buffer layer B41 using carbon and having a thickness of about 15 nm) has a set/reset cycling endurance of about 1E10 times. In addition, in embodiments, the switch element S using the C-doped AsSeGeSi can remain expected switching characteristics. For example, in embodiments, the switch element S using the C-doped AsSeGeSi can have stable or good threshold voltage (Vth), such as about 3.25V. Moreover/otherwise, in embodiments, switch element S using the C-doped AsSeGeSi can have low leakage current, such as off-state current (Ioff) of about 1 nA/@2V.

Table 1 lists the contents of the atoms (unit: at %) of the memory materials and the results of threshold voltage (Vth) and off-state current (Ioff) in an embodiment and a comparative example. In the embodiment, the memory material uses the C-doped AsSeGeSi. In the comparative example, the memory material contains oxygen atom, and is not doped with carbon. From Table 1, it can be observed that compared with the switch element S in the comparative example, the switch element S in the embodiment has better threshold voltage and off-state current.

TABLE 1

| | As | Se | Ge | Si | C | O | Vth | IOFF |
|---|---|---|---|---|---|---|---|---|
| comparative example | 31.3 | 42.3 | 14.4 | 7.5 | — | 4.4 | 3.6 V | 190 pA@ 2 V |
| embodiment | 24.1 | 45.2 | 8.5 | 6.9 | 15.3 | — | 3.25 V | 1 nA @ 2 V |

In other experiments, the set/reset cycling operations are performed to the memory devices of embodiments and comparative examples for 1E9 times, and all of the 66 memory cells M of each of the memory devices are tested to realize if they fail or not. A memory cell would be determined as fail when the criterion of the off-state current after the set/reset cycling operation being five times of the initial off-state current before the set/reset cycling operation achieves. In embodiments, the switch element S of the memory device uses the C-doped AsSeGeSi, and all of 66 memory cells M of which the pass set/reset cycling tests for 1E9 times without fail. In the comparative examples, the switch elements of the memory devices use AsSeGeSi not doped with carbon or un-doped AsSeGeSi, and one memory of the 66 memory cells M of which fails before the $1E9^{th}$ set/reset cycling operation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A switch element, wherein the switch element comprises a memory material consisting essentially of carbon (C) atom, arsenic (As) atom, selenium (Se) atom, germanium (Ge) atom and silicon (Si) atom, wherein the carbon atom occupies 5 at % to 20 at % of the memory material.

2. The switch element according to claim 1, wherein the arsenic atom occupies 23 at % to 32 at % of the memory material.

3. The switch element according to claim 1, wherein the selenium atom occupies 40 at % to 46 at % of the memory material.

4. The switch element according to claim 1, wherein the germanium atom occupies 8 at % to 25 at % of the memory material.

5. The switch element according to claim 1, wherein the silicon atom occupies 5 at % to 20 at % of the memory material.

6. A memory device, comprising:
a first access line;
a second access line; and
a switch element electrically connected between the first access line and the second access line, wherein the switch element comprises a memory material consisting essentially of carbon atom, arsenic atom, selenium atom, germanium atom and silicon atom, wherein the carbon atom occupies 5 at % to 20 at % of the memory material.

7. The memory device according to claim 6, comprising a pillar element electrically connected between the first access line and the second access line, the pillar element comprises the switch element.

8. The memory device according to claim 6, further comprising a buffer layer or an electrode layer on a lower surface and/or an upper surface of the switch element.

9. The memory device according to claim 6, further comprising a phase change material electrically connected between the switch element and the second access line.

10. The memory device according to claim 6, wherein the first access line is one of a bit line and a word line, the second access line is the other of the bit line and the word line, the memory device comprises a plurality of the word lines, a plurality of the bit lines and a plurality of memory cells, the plurality of the memory cells is at intersections between the plurality of the word lines and the plurality of the bit lines, each of the plurality of the memory cells comprises the switch element.

11. The memory device according to claim 6, wherein the switch element is an ovonic threshold switch (OTS).

12. The memory device according to claim 6, comprising a memory cell comprising the switch element.

13. The memory device according to claim 6, wherein the arsenic atom occupies 23 at % to 32 at % of the memory material, or the selenium atom occupies 40 at % to 46 at % of the memory material, or the germanium atom occupies 8 at % to 25 at % of the memory material, or the silicon atom occupies 5 at % to 20 at % of the memory material.

* * * * *